United States Patent [19]

Yamashita

[11] 4,388,596

[45] Jun. 14, 1983

[54] FREQUENCY CONTROLLED SIGNAL GENERATING CIRCUIT

[75] Inventor: Noriyuki Yamashita, Tokyo, Japan

[73] Assignee: Sony Corporation, Tokyo, Japan

[21] Appl. No.: 211,112

[22] Filed: Nov. 28, 1980

[30] Foreign Application Priority Data

Nov. 29, 1979 [JP] Japan .................................. 54-154661
Jun. 30, 1980 [JP] Japan .................................. 55-89426

[51] Int. Cl.³ .............................................. H03L 7/10
[52] U.S. Cl. ..................................... 331/1 A; 328/134; 331/11; 331/17; 331/25; 331/27; 360/51
[58] Field of Search ...................... 331/1 A, 11, 12, 17, 331/18, 25, 27, 23; 455/260; 375/120; 360/51

[56] References Cited

U.S. PATENT DOCUMENTS

| 3,703,686 | 11/1972 | Hekimian | 331/11 |
| 4,069,462 | 1/1978 | Dunn | 331/11 |
| 4,191,976 | 3/1980 | Braun | 360/51 |

Primary Examiner—Siegfried H. Grimm
Attorney, Agent, or Firm—Lewis H. Eslinger; Alvin Sinderbrand

[57] ABSTRACT

A circuit arrangement for generating a frequency controlled signal which is made synchronous with an input signal by an automatic phase control circuit. The circuit comprises a variable frequency oscillator for generating the frequency controlled signal and a phase comparator for generating a first control voltage based on the phase variation of the input signal, the control voltage being supplied to the variable frequency oscillator to control the frequency of the frequency controlled signal. The circuit arrangement includes a circuit for detecting a frequency difference between the frequency controlled signal and a reference signal from a reference oscillator, and a circuit for comparing the outputs from the phase comparator and the frequency difference detecting circuit to produce an additional control voltage to be mixed with the first control voltage.

17 Claims, 63 Drawing Figures

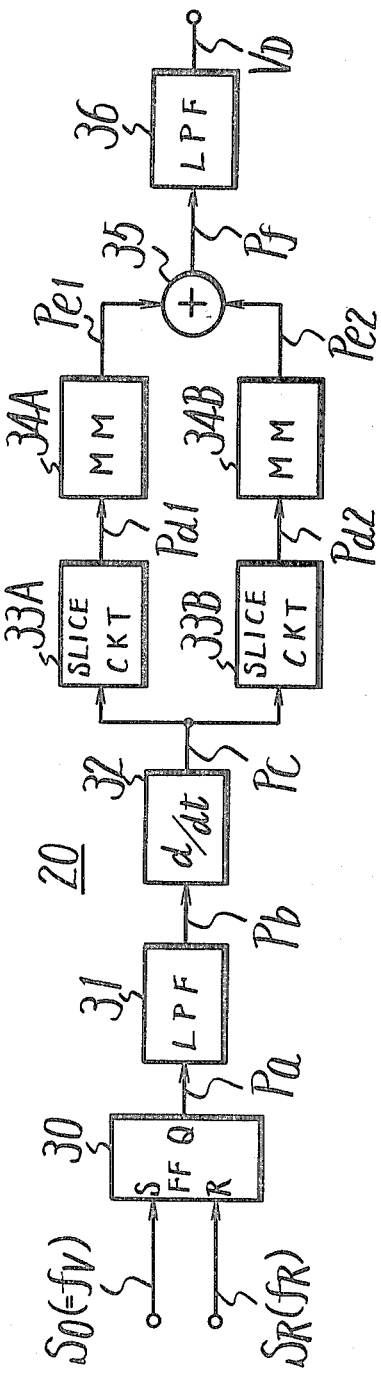
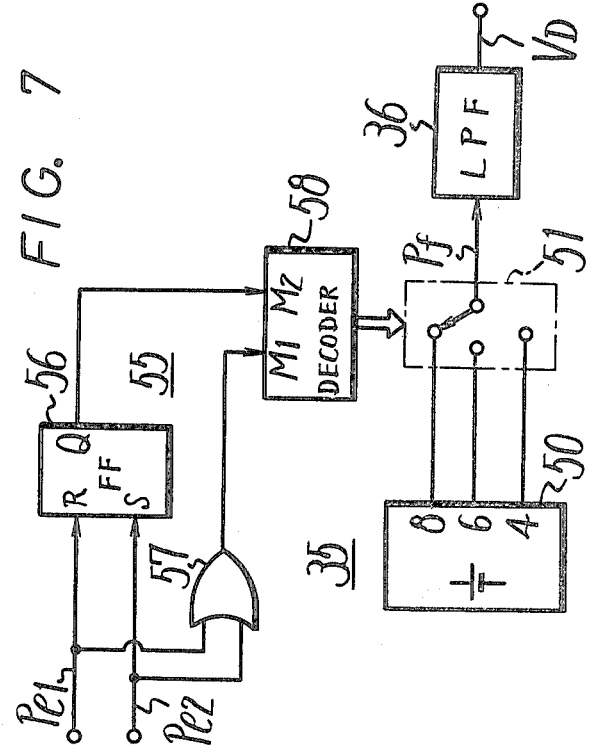
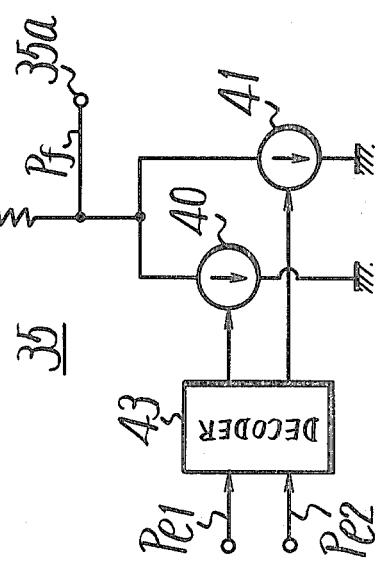

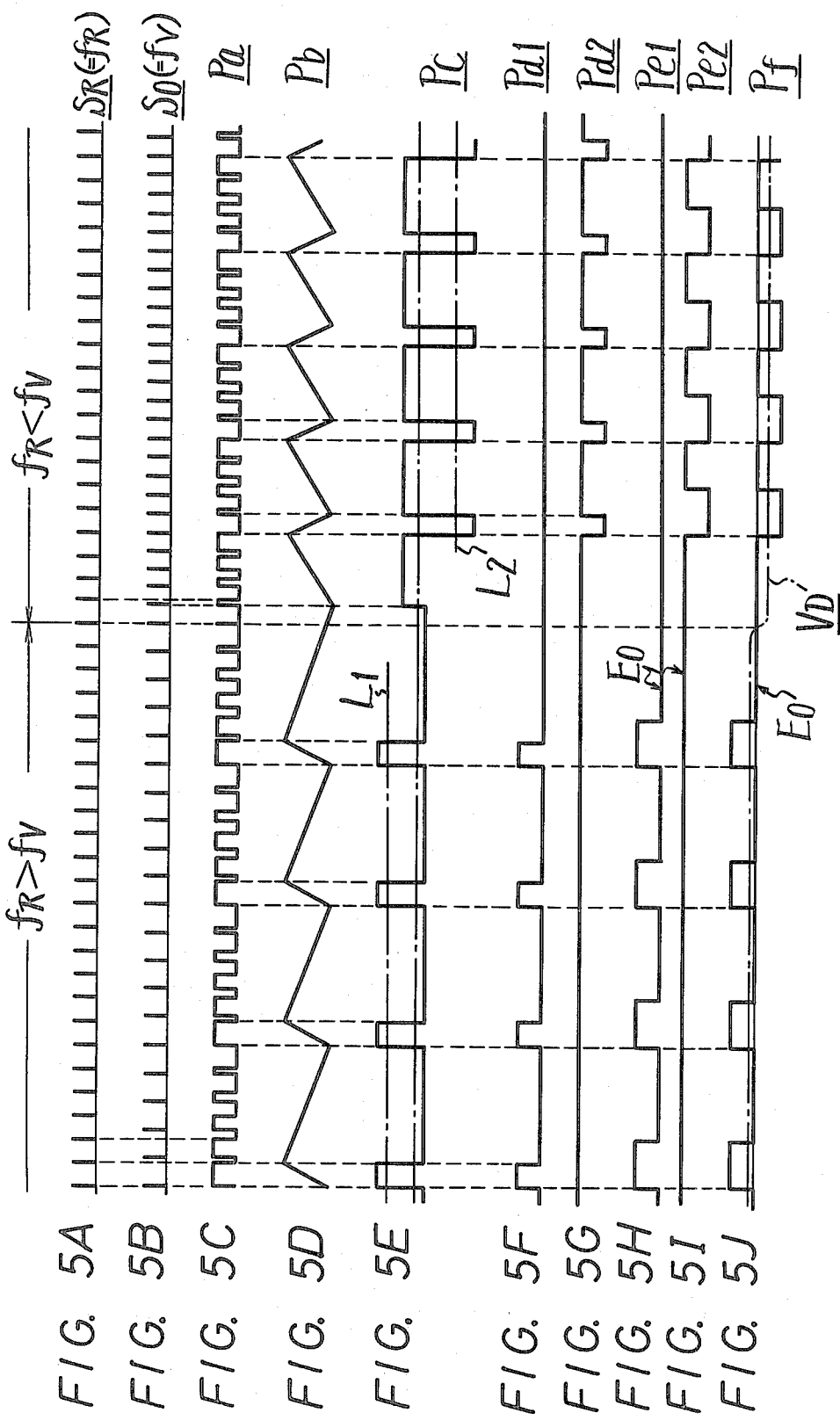

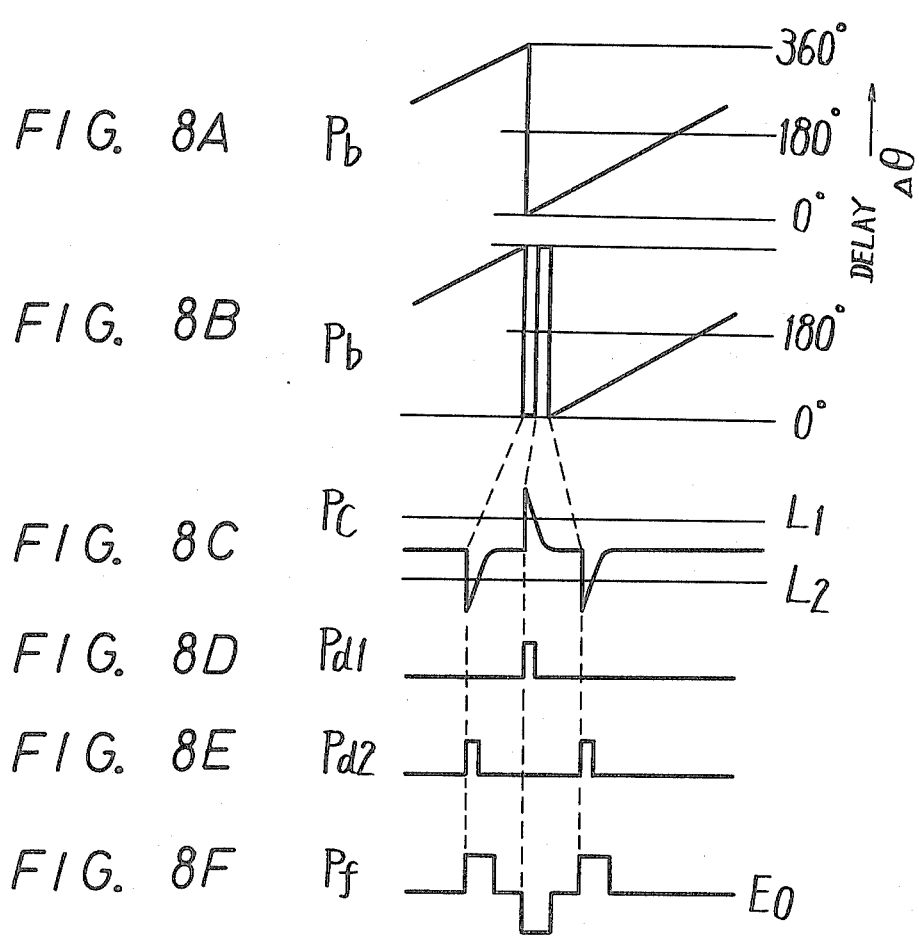

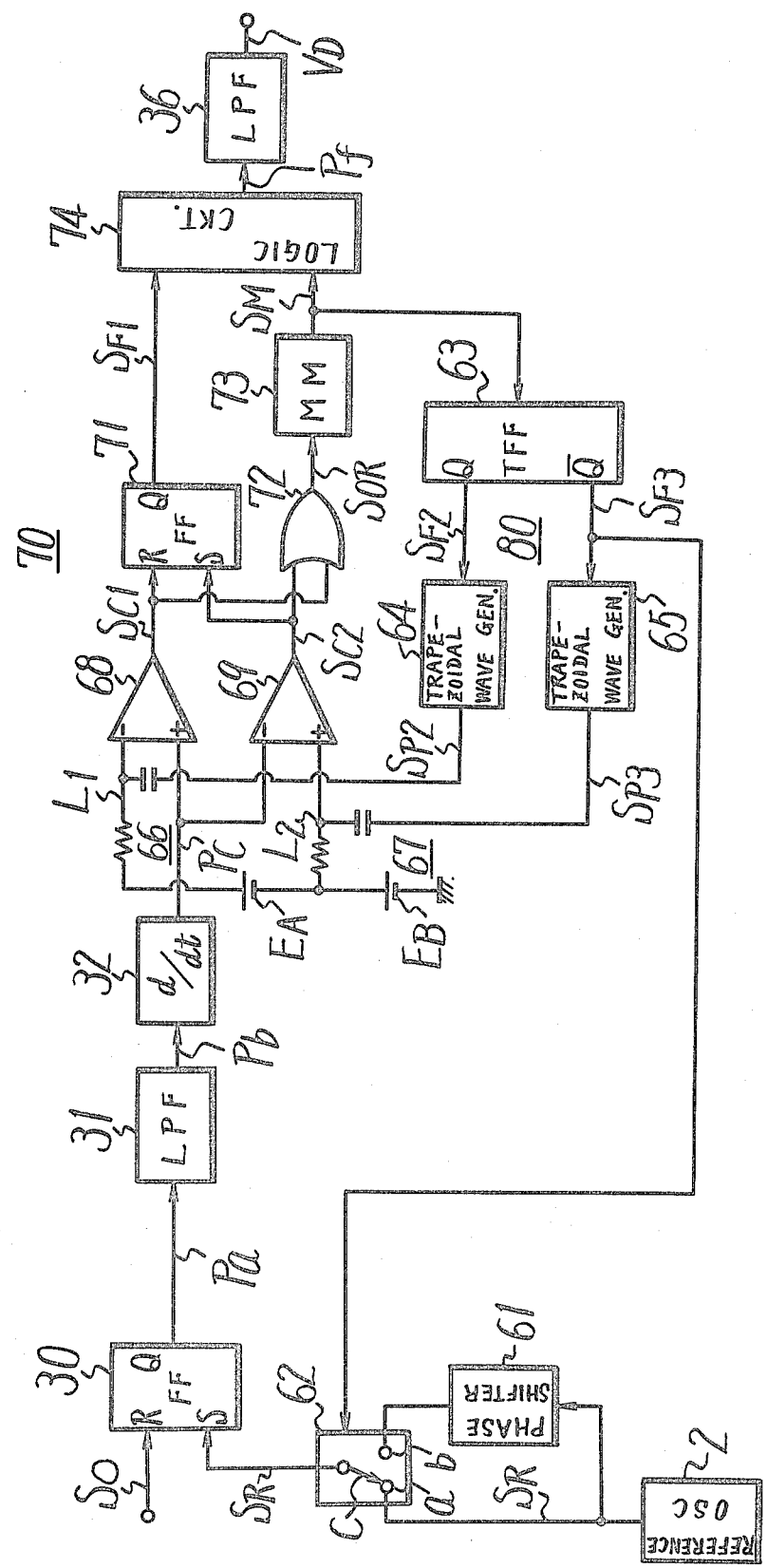

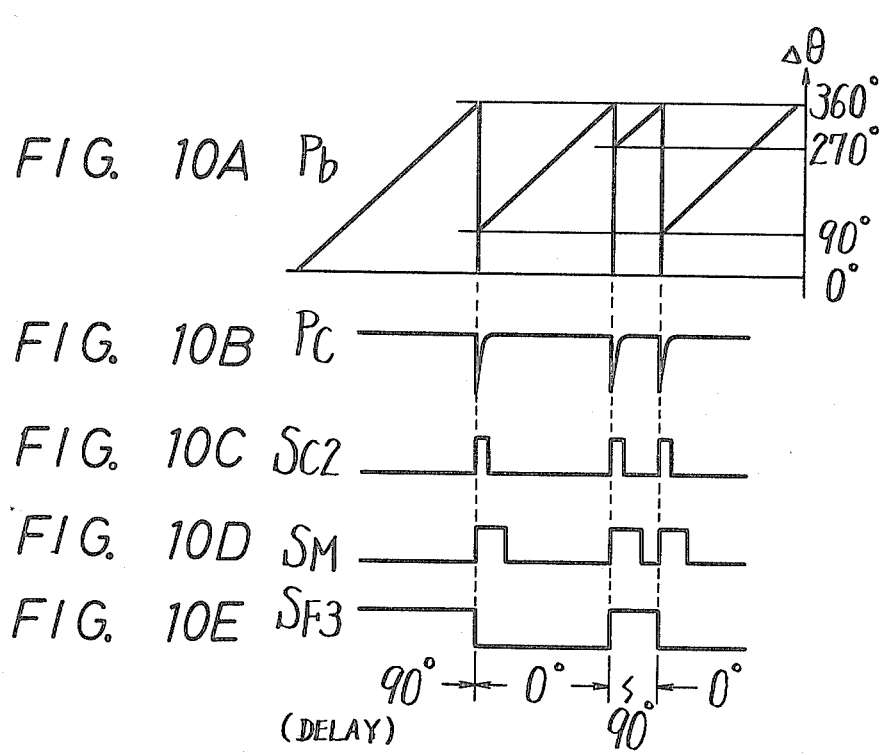
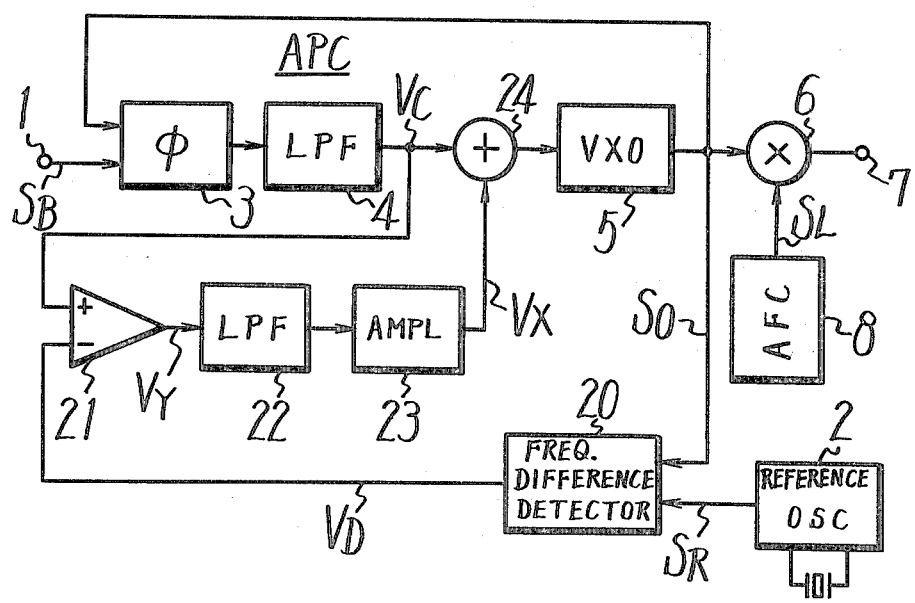

FIG. 11A $P_b$ 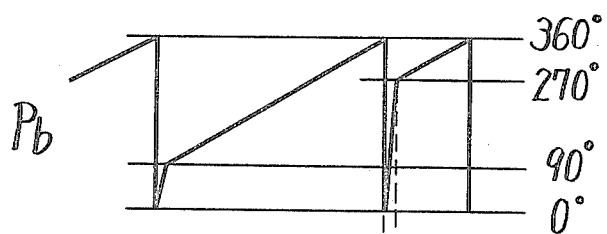
FIG. 11B $P_c$ 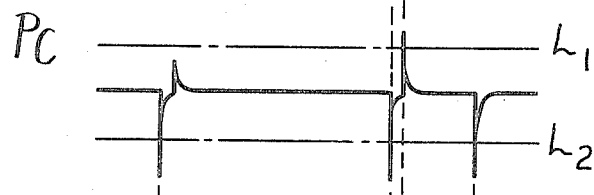
FIG. 11C $S_{C1}$ 
FIG. 11D $S_{C2}$ 
FIG. 11E $S_{F1}$ 
FIG. 11F $S_M$ 
FIG. 11G $P_f$ 
FIG. 11H $S_{F1}$ 
FIG. 11I $P_f$ 

FIG. 12A  Pb  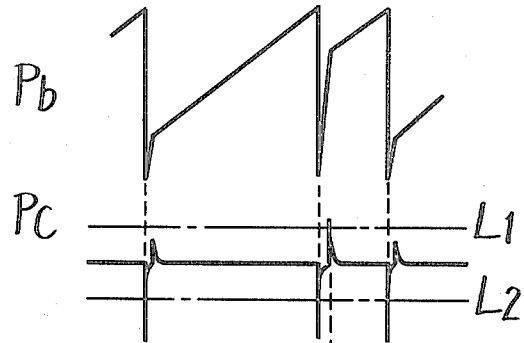
FIG. 12B  Pc  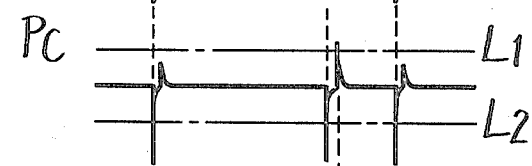
FIG. 12C  Sc1  
FIG. 12D  Sc2  
FIG. 12E  SM  
FIG. 12F  SF1  
FIG. 12G  SF2(Si)  
FIG. 12H  Sp2(Sl)  
FIG. 12I  Pd2(So)  
FIG. 12J  SF3(Si)  
FIG. 12K  Sp3(Sl)  
FIG. 12L  Pd3(So)  
FIG. 12M  Pc  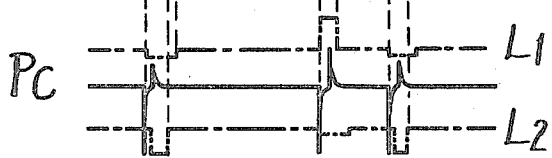

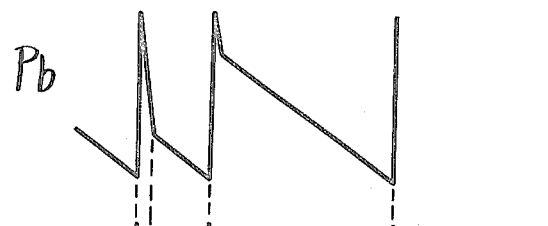
FIG. 13A  Pb
FIG. 13B  Pc  L1  L2
FIG. 13C  Sc1
FIG. 13D  Sc2
FIG. 13E  Sm
FIG. 13F  Sf1
FIG. 13G  Sf2
FIG. 13H  Sp3
FIG. 13I  Pd3
FIG. 13J  Sp2
FIG. 13K  Pd2
FIG. 13L  Pc  L1  L2

FREQUENCY CONTROLLED SIGNAL GENERATING CIRCUIT

BACKGROUND OF THE INVENTION

1. Field of the Invention

The present invention relates generally to a frequency controlled signal generating circuit, and is directed more particularly to a frequency controlled signal generating circuit suitable for use in an APC (automatic phase control) circuit provided in the reproducing system of a VTR (video tape recorder).

2. Description of the Prior Art

In a VTR, the color carrier (chroma) signal is first converted into a low frequency signal and then superimposed on a luminance signal which is, for example, frequency-modulated and thereafter the resulting combined signal is recorded. In a VTR reproducing system there is provided a frequency reconverting circuit, which restores the chroma signal to its original frequency by means of a carrier signal.

The carrier signal for the frequency reconversion is provided by an APC circuit 10 shown in FIG. 1. In the figure, a terminal 1 is supplied with a burst signal $S_B$ (3.58 MHz) which has been separated from a reproduced chroma signal after frequency-reconversion of the latter. The burst signal $S_B$ together with a reference signal $S_R$ (3.58 MHz) derived from a reference oscillator 2 are fed to a phase comparator 3 to be phase-compared therein. The resulting output from the phase comparator 3 is fed to a low-pass filter 4, where output constitutes a control voltage $V_C$ applied to a variable frequency oscillator 5. This oscillator 5 generates a signal with a central frequency of 3.58 MHz plus a jitter component in response to the control voltage $V_C$.

The signal from the oscillator 5 and an oscillating signal $S_L$ (688 KHz in this example) from AFC circuit 8 are both fed to a frequency converting circuit 6 in which a carrier signal $S_C$ having a predetermined frequency (4.27 MHz) is generated. Signal $S_c$ is the carrier signal supplied through a terminal 7 to a frequency-reconverting circuit provided in the color processing circuit of the reproducing side of the VTR for restoring the color carrier from the frequency (688 KHz) with which it is recorded to its standard frequency (3.58 MHz).

With the APC circuit 10 constructed as above, quartz oscillating elements 2a and 5a are used in both the reference oscillator 2 and the variable oscillator 5. If a quartz oscillating element 5a is used as the oscillating element of variable oscillator 5, the control sensitivity of the oscillator is relatively low. Therefore, it becomes difficult to rapidly restore a color signal to its original hue by correcting a large variation of the phase of the reproduced color signal.

On the contrary, a relaxation oscillator not using a quartz element is generally high in control sensitivity and can vary the frequency up to about several tens of KHz. Therefore, such a relaxation oscillator may advantageously be used as the variable oscillator 5. In this situation, however, the problem of frequency drift may occur. Owing to variations in the capacitors and the resistors incorporated in the relaxation oscillator due to their temperature characteristics and so on, the oscillation frequency may fluctuate as much as several hundreds of KHz. An oscillator whose frequency fluctuates in such a fashion is unsuitable for use as variable oscillator 5.

SUMMARY OF THE INVENTION

According to the present invention, there is provided a circuit arrangement for generating a frequency controlled signal synchronous with an input signal, which solves the problem discussed above.

The circuit arrangement according to this invention comprises a variable frequency oscillator which generates a frequency controlled signal, a phase comparator which supplies a control voltage to the variable frequency oscillator based on phase variations in an input signal, a frequency difference detector for detecting a frequency difference between the frequency controlled signal and a reference signal having substantially the same frequency as that of the frequency controlled signal, and a comparing circuit which compares the control voltage with the output of the frequency difference detector and feeds the output of the comparing circuit to the variable frequency oscillator as an additional control voltage.

It is therefore an object of the present invention to provide a frequency controlled signal generating circuit which overcomes the above-described defects.

It is a further object of the present invention to provide a frequency controlled signal generating circuit which is able to compensate for frequency drift in the signal from a variable frequency oscillator.

Still other objects, features and attendant advantages of the present invention will become apparent to a person skilled in the art from the following detailed description, taken in conjunction with the accompanying drawings, throughout which like reference numerals and letters designate like elements and parts.

BRIEF DESCRIPTION OF THE DRAWINGS

FIG. 4 is a block diagram showing a frequency difference detector used in the embodiment of the invention shown in FIG. 2;

FIGS. 5A to 5J are waveform diagrams used to explain the detector shown in FIG. 4;

FIGS. 6 and 7 are block diagrams showing adding circuits which are useable in the detecting circuit shown in FIG. 4;

FIGS. 8A to 8F are waveform diagrams used to explain the detecting circuit shown in FIG. 4;

FIG. 9 is a block diagram showing another embodiment of the frequency difference detector of the invention;

FIGS. 10A to 10E, FIGS. 11A to 11I, FIGS. 12A to 12M and FIGS. 13A to 13L are respectively waveform diagrams used to explain the example shown in FIG. 9; and FIG. 14 is a block diagram showing another embodiment of the variable frequency oscillating circuit according to the invention.

DESCRIPTION OF THE PREFERRED EMBODIMENT

The present invention will be hereinafter described with reference to the accompanying drawings.

By way of example, the present invention will be described as applied to a VTR utilizing the recording system described previously.

Figure 1:
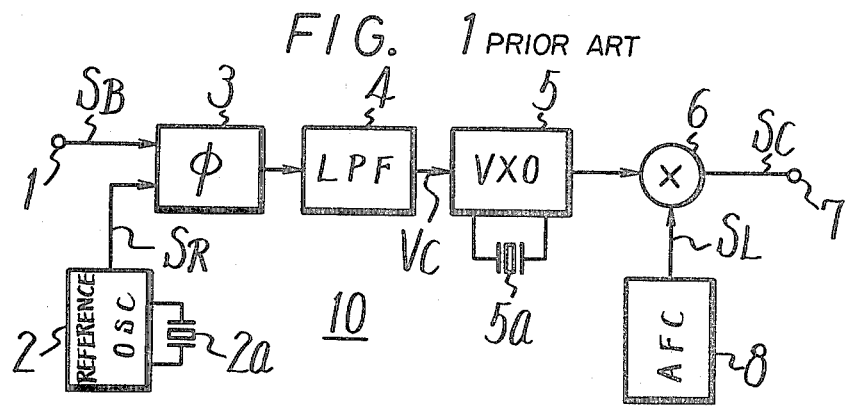
FIG. 1 is a block diagram showing a conventional APC circuit.
Figure 2:
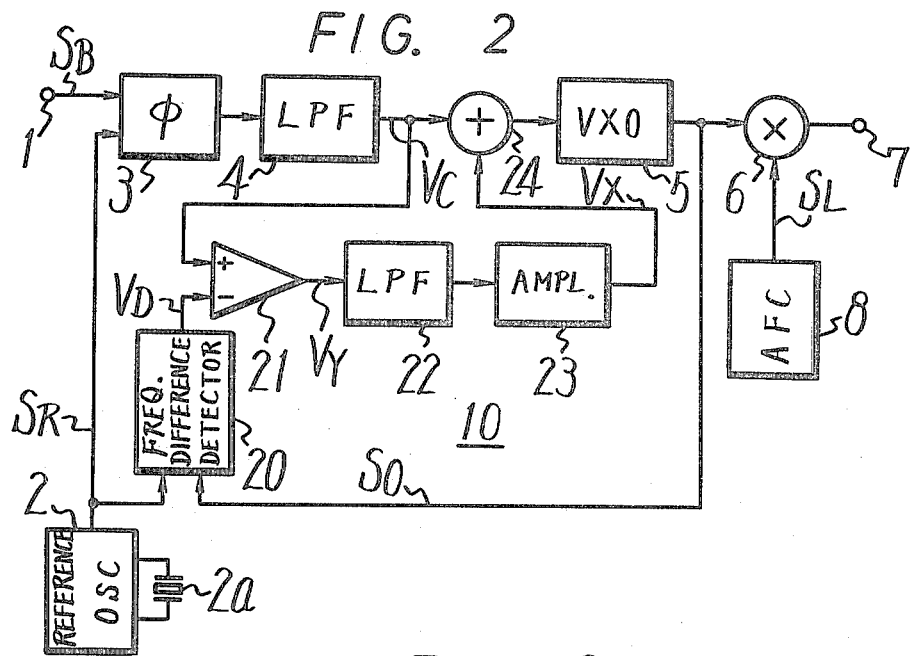
FIG. 2 is a block diagram showing one embodiment of a variable frequency oscillating circuit according to the present invention.

FIG. 2 is a block diagram of an embodiment of the variable oscillating circuit. In this embodiment, variable oscillator 5 is a variable relaxation oscillator not having a quartz element, such as an emitter coupled multivibrator or a variable oscillator using a ceramic filter, used as set forth above. The control sensitivity of variable oscillator 5 adjusted such that its oscillation frequency can be varied by control voltage $V_C$ by an amount preferably not exceeding $\pm 15$ KHz. A desirable figure, for example, is about $\pm 10$ KH$_z$. In FIG. 2, the elements that are the same as those of FIG. 1 are marked with the same reference numerals and their description will be omitted for the sake of brevity.

Figure 3:
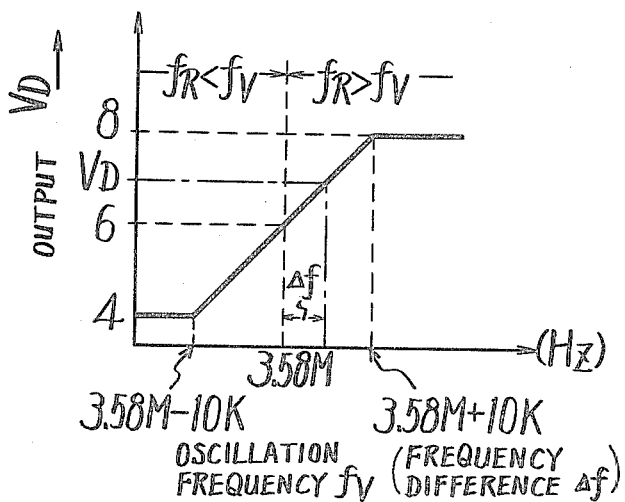
FIG. 3 is a graph showing the output from the frequency difference detector used in the embodiment of FIG. 2.

In the embodiment shown in FIG. 2, a frequency difference detecting circuit or detector 20 is provided which detects the frequency difference between reference output $S_R$ from reference oscillator 2 and oscillation output $S_O$ from the variable oscillator 5. This detector 20 produces an output $V_D$ which is in proportion to a frequency difference $\Delta f$ as shown in the graph of FIG. 3. The output $V_D$ together with the control voltage $V_C$ from low-pass filter 4 are applied to a differential amplifier 21 of high gain whose output $V_Y$ is applied through a low-pass filter 22 to an amplifier 23 which is used for adjusting the sensitivity of the circuit. An output voltage $V_X$ from the amplifier 23 is applied to an adder 24 to be added to the above control voltage $V_C$ and then fed to variable oscillator 5.

If variable oscillator circuit 10 for use in an APC circuit is constructed as shown in FIG. 2, the relation of oscillation frequency $f_V$ of variable oscillator 5 to control voltages $V_C$ and $V_X$ is as expressed by the following equation (1), and the relation of the output $V_D$ from detector 20 to frequency difference $\Delta f$ is as expressed by the following equation (2):

$$f_V = f_R + K_1 V_C + K_2 V_X + f_e \qquad (1)$$

$$V_D = K_3 \Delta f = K_3 (f_V - f_R) \qquad (2)$$

wherein
$K_1$ is the modulation sensitivity of variable oscillator 5 viewed from the terminal of control voltage $V_C$;
$K_2$ is the modulation sensitivity of variable oscillator 5 viewed from the terminal of control voltage $V_X$, $K_2$ is greater than $K_1$;
$K_3$ is the demodulation sensitivity of detecting circuit 20; $f_R$ is the oscillation frequency of reference oscillator 2; and
$f_e$ is an error frequency caused by drift.

From the equation (1), the control voltage $V_C$ is expressed as follows:

$$V_C = \frac{1}{K_1} (f_V - f_R - K_2 V_X - f_e) \qquad (3)$$

The output $V_Y$ is expressed as follows:

$$V_Y = K_4 (V_C - V_D) \qquad (4)$$

wherein $K_4$ is the gain of differential amplifier 21.

Substituting the equations (2) and (3) into the equation (4), the following equation (5) is obtained:

$$V_Y = K_4 \left( \frac{1}{K_1} - K_3 \right) (f_V - f_R) - \frac{K_4}{K_1} (K_2 V_X + f_e) \qquad (5)$$

If the product of modulation sensitivity $K_1$ and demodulation sensitivity $K_3$ is selected to satisfy the following equation (6), $$K_1 \cdot K_3 = 1 \qquad (6)$$

the equation (5) becomes as follows:

$$V_Y = -\frac{K_4}{K_1} (K_2 V_X + f_e) \qquad (7)$$

Since $V_Y$, for low frequencies, approximates $V_X$, the control voltage $V_X$ is expressed as follows:

$$V_X = -\frac{K_4}{K_1 + K_2 K_4} \cdot f_e \qquad (8)$$

When the gain $K_4$ of the differential amplifier 21 is sufficiently large, the equation (8) can be rewritten as follows:

$$V_X = -\frac{1}{K_2} \cdot f_e \qquad (9)$$

By substituting the equation (9) into the equation (1), the following equation (10) is obtained.

$$f_V = f_R + K_1 V_C + K_2 \left( -\frac{1}{K_2} \cdot f_e \right) + f_e \qquad (10)$$

$$= f_R + K_1 V_C$$

From the equation (10), it is apparent that the fluctuation of oscillation frequency $f_V$ due to drift has been removed.

Further, if the product of $K_1$ and $K_3$ in equation (6) is not exactly 1, the variable oscillator 5 becomes stable at a frequency somewhat deviated from the intended frequency 3.58 MHz.

Thus, if variable oscillator 5 is controlled by setting output $V_D$ (which is based on the frequency difference $\Delta f$ between the frequency of output $S_O$ of the variable oscillator 5 and the frequency of output $S_R$ of oscillator 2) equal to control voltage $V_C$, fluctuation of oscillation frequency $f_V$ due to drift in the variable oscillator 5 can be removed.

If control voltage $V_C$ is constant and oscillation frequency $f_V$ drift by $\Delta f_V$, output $V_D$ increases by $\Delta V_D$ in proportion to $\Delta f_V$. As a result, output $V_Y$ decreases by $-\Delta V_Y$, and control output voltage $V_X$ also decreases by $-\Delta V_X$, reducing the drift $\Delta f_V$ of oscillation frequency $f_V$ to zero. If the control voltage $V_C$ is varied, as will be apparent from the equation (10), the oscillation frequency $f_V$ varies in response.

On the other hand, if the control voltage $V_C$ contained AC components higher than the response speed of the detecting circuit 20, $V_D$ could not be set equal to $V_C$, and the output $V_Y$ from the differential amplifier 21 would not become zero. To solve this problem, however, if the time constant of low-pass filter 22 is selected to be sufficiently long, no external disturbance is applied to variable oscillator 5. Thus, the control voltage $V_X$ is again set to zero, the mean value of control voltage $V_C$ being equal to that of output $V_D$, whereby the oscillation frequency $f_V$ becomes always equal to the reference frequency $f_R$.

If the detecting circuit 20 is constructed as shown in FIG. 4, an output $V_D$ having the characteristic shown in the graph of FIG. 3 can be produced.

In the embodiment of FIG. 4, the oscillation output $S_O$ (refer to FIG. 5B) from the oscillator 5 is applied to a set terminal S of a flip-flop circuit 30, while the reference output $S_R$ (refer to FIG. 5A) is applied to its reset terminal R. Thus, the flip-flop circuit 30 produces an output $P_a$ shown in FIG. 5C. This output $P_a$ is smoothed by a low-pass filter 31 whose output $P_b$ (refer to FIG. 5D) is applied to a differentiation circuit 32, in which the output $P_b$ is differentiated to produce a pulsed signal $P_c$ shown in FIG. 5E. As is apparent from FIG. 5E, when the oscillation frequency $f_V$ is lower than the reference frequency $f_R$, the polarity of the pulses of signal $P_c$ is positive, and when $f_V$ is higher than $f_R$, they are negative.

Signal $P_c$ is applied to a first slice circuit 33A whose slice level is a positive slice level $L_1$ and also to a second slice circuit 33B whose slice level is a negative slice level $L_2$. Thus, the first slice circuit 33A produces a first output $P_{d1}$ shown in FIG. 5F and the second slice circuit 33B produces a second sliced output $P_{d2}$ shown in FIG. 5G. The outputs $P_{d1}$ and $P_{d2}$ are respectively supplied to monostable multivibrators 34A and 34B whose outputs $P_{e1}$ and $P_{e2}$ with predetermined widths, as shown in FIGS. 5H and 5I, are then fed to an adding circuit 35 to be added. If the reference levels of the outputs $P_{e1}$ and $P_{e2}$ are a level $E_O$ as shown in FIGS. 5H and 5I, the added output from the adding circuit 35 becomes $P_f$ as shown in FIG. 5J. Then, if the added output $P_f$ is smoothed by a low-pass filter 36, a DC output $V_D$ corresponding to the frequency difference between oscillation frequency $f_V$ and reference frequency $f_R$ is obtained as shown in one dot-dash line of FIG. 5J. As set forth above, if the detecting circuit 20 is formed with the construction shown in FIG. 4, the output having the frequency difference versus detected output characteristic shown in the graph of FIG. 3 can be obtained.

In certain cases, the multivibrators 34A and 34B shown in FIG. 4 may be omitted.

Practical examples of the adding circuit 35 are shown in FIGS. 6 and 7.

The example of adding circuit 35 shown in FIG. 6 is a current circuit. In this case, a pair of unit current sources 40 and 41 are connected in parallel and an output terminal 35a is connected to their junction. Outputs $P_{e1}$ and $P_{e2}$ are applied to a decoder 43 for controlling the current sources and the outputs from the decoder 43 are respectively applied to current sources 40 and 41 to control the ON and OFF thereof as desired.

By way of example, in order that the output $V_D$ becomes maximum when $f_R > f_V$ and minimum when $f_R < f_V$ as shown in FIG. 5, it is enough to assemble the logic circuit such that when $f_R > f_V$ both the current sources 40 and 41 become ON, when $f_R < f_V$ current sources 40 and 41 become both OFF and when $f_R = f_V$ only one of current sources 40 and 41 becomes ON.

In case of FIG. 7, the adding circuit 35 is a voltage circuit. In this case, a reference voltage source 50, which will produce three values, for example, 4V, 6V and 8V, and a switching circuit 51, are provided. This switching circuit 51 is desirably controlled by the output from a control circuit 55 which is formed of a flip-flop circuit 56, an OR circuit 57 and a decoder 58 as shown in FIG. 7. The logical operation of circuit 55 is shown in Table 1.

TABLE 1

| $f_R, f_V$ | $M_1$ | $M_2$ | $P_f$(volts) |
|---|---|---|---|
| $f_R < f_V$ | 0 | 0 | 6 |
|  | 1 | 0 | 4 |
| $f_R > f_V$ | 0 | 1 | 6 |
|  | 1 | 1 | 8 |

However, in the circuit shown in FIG. 4, the flip-flop circuit 30 may malfunction under certain conditions. That is, as shown in FIG. 8A, when the phase difference between the oscillating signal and the reference signal exceeds 360°, a sawtooth waveform output $P_b$ with inverted polarity appears. Also, when the phase difference is near 0°, the magnitude of the sawtooth waveform output $P_b$ fluctuates considerably if jitter or noise causes a slight variation of the phase difference, as shown in FIG. 8B. Therefore, when a sawtooth waveform output $P_b$ having such an irregular level variation is utilized, the variable oscillator 5 will malfunction. FIGS. 8D and 8E indicate the outputs of the slice circuits 33A and 33B and FIG. 8F indicates irregular output $P_f$ of the adder 35 in such a situation.

FIG. 9 shows another embodiment of the frequency difference detector 20 which avoids the above-described malfunction. The detector 20 of this example is provided with a phase-jump circuit which prevents the reinversion of the sawtooth waveform signal owing to noise or jitter, once the phase difference between the input signals $S_O$ and $S_R$ becomes 0° or 360°. The detector 20 is further provided with an improved voltage comparator 70 which compensates for the irregularity of the differentiated signal $P_c$ caused by the phase jump of the serrated wave signal $P_b$.

In this embodiment, the phase-jump circuit comprises a phase shifter 61 of 90° and a switching circuit 62. The reference signal $S_R$ from the reference oscillator 2 is supplied to one fixed terminal a of the switching circuit 62, and also to the phase shifter 61. The reference signal $S_R$, phase-shifted by 90°, is supplied to another fixed terminal b of the switching circuit 62. The switching element c of circuit 62 is connected with the set-terminal S of the flip-flop 30. As described hereinafter in detail, the switching circuit 62 is controlled by the signal from the voltage comparator 70.

The voltage comparator 70 basically comprises a pair of comparators 68 and 69. The differentiated signal $P_c$ from the differentiation circuit 32 (refer to FIG. 10B) is supplied to the positive terminal of the comparator 68 and to the negative terminal of the comparator 69. The high reference level $L_1$ produced by DC voltage sources $E_A$ and $E_B$ is supplied to the negative terminal of the comparator 68 and the low reference level $L_2$ produced by DC voltage source $E_B$ is supplied to the positive terminal of the comparator 69. The outputs $S_{c1}$ and $S_{c2}$ (refer to FIG. 10C) of the comparators 68 and 69 are supplied to the reset and set terminals R and S of flip-flop 71, respectively, and also to OR-circuit 72, the output $S_{OR}$ of which is further supplied to retriggerable mono-stable multivibrator 73. It is herein noted that the output $S_{F1}$ of the flip-flop 71 indicates which of the signals $S_V$ and $S_R$ is larger in frequency and the output $S_M$ of the multivibrator 73 indicates the times at which the signals $S_{c1}$ and $S_{c2}$ appear. The signals $S_{F1}$ and $S_M$ are supplied to a logic circuit 74, in which the pulse signal $P_f$ shown in FIG. 5J will be produced in response to the signals $S_{F1}$ and $S_M$. Further, the voltage comparator 70 is provided with a reference level modifying circuit 80 which comprises a T-type flip-flop 63 triggered by the signal $S_M$ and a pair of trapezoidal wave generators 64 and 65 whose inputs are outputs $S_{F2}$ and $S_{F3}$ of the flip-flop 63, respectively. As hereinafter explained in detail, outputs $S_{P2}$ and $S_{P3}$ of the trapezoidal wave generators 64 and 65 are respectively supplied to the negative terminal of the comparator 68 and the positive terminal of the comparator 69 to modify the reference levels $L_1$ and $L_2$.

According to the example of the invention shown in FIG. 9, the phase of reference output $S_R$ is shifted by 90° by the phase shifter 61 which in this embodiment is a phase delay circuit. In this case, signal $S_{F3}$ (refer to FIG. 10E) which is provided by applying the output $S_M$ to T-type flip-flop 63 is used as the switching pulse.

That is, as shown in FIG. 10D, the output $S_M$ from multivibrator 73 is obtained in response to the falling edge of sawtooth waveform signal $P_b$ shown in FIG. 10A. The rising edge of signal $S_M$ is detected by flip-flop 63. Thus, if the phase of reference output $S_R$ is shifted at 90° by the pulse $S_{F3}$ which detects the rising edge of output $S_M$, the phase difference $\Delta\theta$ between oscillation output $S_O$ and reference output $S_R$ is changed thereby to either 270° or 90°. Therefore, even though there may exist jitter or noise, the fluctuation shown in FIG. 8B is removed and hence the malfunctioning or variable oscillator 5 is avoided.

In the example of FIG. 9, when the pulse $S_{F3}$ is "1", the switching circuit 62 is changed over to the position shown in the figure.

When it is detected that the phase difference is 0° or 360°, the phase of reference output $S_R$ shifted by 90°. The phase difference between oscillation output $S_O$ and reference output $S_R$ becomes 270° or 90° depending upon the phase condition of reference output $S_R$. Thus, the output $P_c$ from differentiator 32 shown in FIG. 11B is obtained. In this case, since the positive differentiated pulse when the phase difference is 270° is larger than that when the phase difference is 90°, it may occur when the phase difference is 270° that the positive pulse exceeds the first reference level $L_1$. When the positive differentiated pulse exceeds the first reference level $L_1$, the first comparator output $S_{c1}$ shown in FIG. 11C is obtained. Thus, after the output $S_{F1}$ from flip-flop 71 (refer to FIG. 11E) and output $S_M$ from multivibrator 73 (refer to FIG. 11F) are processed by logic circuit 74, a pulse output $P_f$ shown in FIG. 11G is obtained. Therefore, the variable oscillator 5 may malfunction as described previously.

However, if the positive pulse $P_c$ does not exceed the first reference level $L_1$, the output $S_{F1}$ from flip-flop 71 becomes as shown in FIG. 11H. Therefore, in this situation the normal control operation is carried out by the pulse output $P_f$ shown in FIG. 11I.

For this reason, an improvement for avoiding the described complication inherent in the phase shift of 90° is included in the embodiment of FIG. 9. In this example, an output $S_{F2}$ (refer to FIG. 12G) from flip-flop circuit 63 is fed to first trapezoidal wave generator 64 which then produces a trapezoidal wave output $S_{P2}$ whose inclined portion corresponds to the rising edge of output $S_{F2}$ as shown in FIG. 12H. This output $S_{P2}$ is applied for a circuit 66 to produce a differentiated pulse output $P_{d2}$ (refer to FIG. 12I). This pulse $P_{d2}$ is superimposed on the first detecting level $L_1$ which is provided to the voltage comparator 68. In the pulse $P_{d2}$, the part corresponding to the rising edge of the trapezoid wave output $S_{P2}$ is a sharp positive pulse while the inclined portion thereof is only a small negative pulse. Accordingly, this circuit functions as a differentiation circuit suppressing the negative pulse.

As described above, the differentiated pulse $P_{d2}$ with the peak value of $L_a$ is superimposed on the first reference level $L_1$. The reference level is raised up by the above differentiated pulse $P_{d2}$ in the vicinity of the positive pulse $P_c$ having relatively high peak value as shown in FIG. 12M, so that the first comparator outut $S_{C1}$ does not include the positive pulse shown in FIG. 11C. As a result, the output $S_{F1}$ from flip-flop 71 (FIG. 12F) does not fall as it did in FIG. 11E, thereby avoiding any malfunctioning of variable oscillator 5. Thus, the desirable operation described above and shown in FIGS. 11H and 11I is achieved.

The inverted output $S_{F3}$ from flip-flop 63 (FIG. 12J) is fed to the second trapezoidal wave generator 65 which then produces a trapezoid wave output $S_{P3}$ whose rising edge is inclined as shown in FIG. 12K. This trapezoid wave output $S_{P3}$ is then fed to a differentiation circuit 67 from which a pulse output $P_{d3}$ is produced in which the positive pulses are suppressed as shown in FIG. 12L. This pulse $P_{d3}$ is superimposed on the second reference level $L_2$ which is provided to the second voltage comparator 69. Accordingly, the reference level $L_2$ is changed as shown in FIG. 12M. When pulse $P_{d3}$ is superimposed, the reference level $L_2$ may be varied at the approximate time of some of the negative pulses $P_c$, but this does not interfere with the detection of the pulses $P_c$, as the times of occurrence of the pulses $P_{d3}$ and $P_c$ are sufficiently separated.

When $f_R < f_V$, the outputs become as shown in FIG. 13. In this case, the generation of second compared output $S_{C2}$ which will cause misoperation can be suppressed by the differentiated pulse $P_{d3}$ superimposed on the second reference level $L_2$. No detailed explanation is provided for this case, because the operation is generally the same as that of FIG. 12.

FIG. 14 shows another embodiment of the variable frequency oscillating circuit 10 shown in FIG. 2. In FIG. 14, the oscillating signal from the variable frequency oscillator 5 is directly compared with the input signal $S_B$. This type of oscillating circuit is preferable for use in the APC circuit of a video tape recorder, in which the burst signal, which is separated from the chrominance signal, is applied to the phase comparator 3 as the input signal $S_B$.

Although illustrative embodiments of this invention have been described in detail herein with reference to the accompanying drawings, it is to be understood that the invention is not limited to those precise embodiments, and that various changes and modifications may be effected therein by one skilled in the art without departing from the spirit and scope of the invention, as defined in the appended claims.

I claim as my invention:

1. A circuit arrangement for generating a frequency controlled signal which has its phase made synchronous with an input signal, comprising:
   a variable frequency oscillator for generating the frequency controlled signal;
   means for providing a reference signal;

a phase control circuit including a phase comparator for generating, as its output, a control signal based on the phase relation of said input and reference signals, said control signal being supplied to said variable frequency oscillator to control the phase of said frequency controlled signal;

means for detecting a frequency difference between said frequency controlled and reference signals and providing a corresponding output; and means for comparing the outputs of the phase comparator and the frequency difference detecting means to produce an additional control signal which is mixed with the first mentioned control signal for further controlling said variable frequency oscillator.

2. A circuit arrangement according to claim 1; in which said frequency difference detecting means comprises means for generating a difference signal having a frequency corresponding to the frequency difference between said frequency controlled signal and said reference signal, means for differentiating said difference signal to produce a differentiator output signal, a level comparator for comparing said differentiator output signal with first and second reference levels, said level comparator generating a first output signal when said differentiator output signal is higher than said first reference level and a second output signal when said differentiator output signal is lower than said second reference level, and means for combining said first and second output signals to produce a DC output signal proportional to said frequency difference.

3. A circuit arrangement according to claim 2; in which said difference signal generating means comprises a flip-flop having set and reset terminals to which said reference signal and said frequency controlled signal are respectively supplied, and a low-pass filter for wave-forming an output from said flip-flop to obtain said difference signal.

4. A circuit arrangement according to claim 3; in which said difference signal generating means further comprises phase-shifting means for shifting said reference signal by a predetermined phase amount when the phase difference between said frequency controlled signal and said reference signal becomes 0° or 360°.

5. A circuit arrangement according to claim 4; in which said phase-shifting means comprises a phase shifter for phase shifting said reference signal by 90° and switching means whose inputs are said reference signal and the output of said phase shifter, the output of the switching circuit being supplied to the set-terminal of said flip-flop.

6. A circuit arrangement according to claim 2; in which said level comparator comprises first slicing means having a slicing level of said first reference level and second slicing means having a slicing level of said second reference level.

7. A circuit arrangement according to claim 2; in which said level comparator comprises first and second differential amplifiers for generating said first and second output signals respectively, said differentiator output signal being supplied to a positive terminal of said first differential amplifier and a negative terminal of said second differential amplifier, and said first and second reference levels being respectively supplied to the negative terminal of said first differential amplifier and the positive terminal of said second differential amplifier.

8. A circuit arrangement according to claim 6 or claim 7; in which said combining means comprises a decoder for receiving said first and second output signals and a voltage generator controlled by said decoder for generating one of a plurality of DC voltage levels in response to the occurrence of at least one of said first and second output signals.

9. A circuit arrangement according to claim 8; in which said voltage generator comprises a pair of constant current sources which are controlled by said decoder such that both of the constant current sources operate when said first output signal is supplied to the decoder, one of the constant current sources operates when neither of said first and second output signals is supplied thereto and neither of the constant sources operates when said second output signal is supplied thereto.

10. A circuit arrangement according to claim 8; in which said voltage generator comprises a voltage source for generating high, medium, and low voltage levels and switch means controlled by said decoder for receiving said three voltage levels and producing the high voltage when said first output signal is supplied to the decoder, the medium voltage when neither of said first and second output signals is supplied thereto and the low voltage when said second output signal is supplied thereto.

11. A circuit arrangement according to claim 6 or claim 7; in which said combining means comprises means for receiving said first and second output signals and producing a first indicating signal which indicates which of said first and second output signals is received, and means for receiving said first and second output signals and producing a second indicating signal which indicates that either of said first and second output signals is received.

12. A circuit arrangement according to claim 11; in which said first indicating signal producing means comprises a second flip-flop which has a set terminal for receiving said second output signal and a reset terminal for receiving said first output signal.

13. A circuit arrangement according to claim 11; in which said second indicating signal producing means comprises an OR-gate which receives said first and second output signals.

14. A circuit arrangement according to claim 2; in which said level comparator further comprises means for modifying said first and second reference levels such that said first reference level becomes higher at a predetermined interval after said differentiator output signal is detected to be lower than said second reference level and said second reference level becomes lower at a predetermined interval after said differentiator output signal is detected to be higher than said first reference level.

15. A circuit arrangement according to claim 14; in which said modifying means comprises a third flip-flop triggered by said first and second output signals for producing first and second rectangular wave signals which have opposite phases to each other, first and second trapezoidal wave generators which respectively receive said pair of rectangular wave signals, first and second differentiating means for differentiating the respective trapezoidal wave signals from said pair of trapezoidal waveform generators, and adding means for adding the outputs of said first and second differentiating means to said first and second reference levels, respectively.

16. A circuit arrangement according to claim 1; wherein said means for providing said reference signal includes feedback means from said variable frequency oscillator to said phase comparator, and a reference oscillator having its output supplied to said frequency difference detecting means.

17. A circuit arrangement according to claim 1; wherein said means for providing said reference signal is a reference oscillator having its output supplied to both said phase comparator and said frequency difference detecting means.

* * * * *